(12) United States Patent
Hopkin et al.

(10) Patent No.: US 10,899,605 B2
(45) Date of Patent: *Jan. 26, 2021

(54) MEMS DEVICE AND MANIPULATION METHOD FOR MICRO-OBJECTS

(71) Applicant: Sharp Kabushiki Kaisha, Osaka (JP)

(72) Inventors: Hywel Hopkin, Oxford (GB); Nathan Smith, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 403 days.

This patent is subject to a terminal disclaimer.

(21) Appl. No.: 15/911,705

(22) Filed: Mar. 5, 2018

(65) Prior Publication Data

US 2019/0270638 A1    Sep. 5, 2019

(51) Int. Cl.
*B81B 7/00* (2006.01)
*B81B 3/00* (2006.01)
*B81C 1/00* (2006.01)
*H05K 13/04* (2006.01)

(52) U.S. Cl.
CPC .......... *B81B 7/0061* (2013.01); *B81B 3/0021* (2013.01); *B81C 1/0023* (2013.01); *B81C 1/00158* (2013.01); *B81C 1/00333* (2013.01); *H05K 13/0408* (2013.01)

(58) Field of Classification Search
CPC ............................ B81B 7/0061; B81B 3/0021
See application file for complete search history.

(56) References Cited

U.S. PATENT DOCUMENTS

| 6,829,131 | B1 | 12/2004 | Loeb et al. |
| 8,363,380 | B2 | 1/2013 | Lan et al. |
| 8,780,673 | B2 | 7/2014 | Cohen et al. |
| 8,849,087 | B2 | 9/2014 | Breen et al. |
| 10,636,936 | B2 * | 4/2020 | Hopkin ................. B81B 7/0061 |
| 2003/0044029 | A1 | 3/2003 | Gabriel et al. |
| 2006/0226501 | A1 | 10/2006 | Allen |
| 2013/0089224 | A1 * | 4/2013 | Dehe ........................ H04R 7/04 381/191 |
| 2013/0135705 | A1 * | 5/2013 | Hong ................... G02B 26/001 359/290 |

FOREIGN PATENT DOCUMENTS

| GB | 2469412 | 10/2010 |
| WO | WO 2014141258 | 9/2014 |

* cited by examiner

*Primary Examiner* — Scott Bauer
(74) *Attorney, Agent, or Firm* — Renner, Otto, Boisselle & Sklar, LLP

(57) ABSTRACT

A micro-electro-mechanical systems (MEMS) includes a flexible membrane that creates a suction force by flexing to permit manipulation of a microscale object. The MEMS element includes a casing structure; a flexible membrane attached to the casing structure; and an electrode structure, wherein a voltage applied to the electrode structure causes the flexible membrane to flex relative to the casing structure. The flexible membrane and the casing structure define a gap into which the flexible membrane may flex, and a foot extending from the flexible membrane in a direction away from the casing structure, wherein the foot and the flexible membrane define a clearance region on an opposite side of the flexible membrane from the gap. When the MEMS element interacts with an object to be manipulated the foot spaces the membrane apart from the object, and flexing of the membrane generates the suction force for manipulating the object.

20 Claims, 7 Drawing Sheets

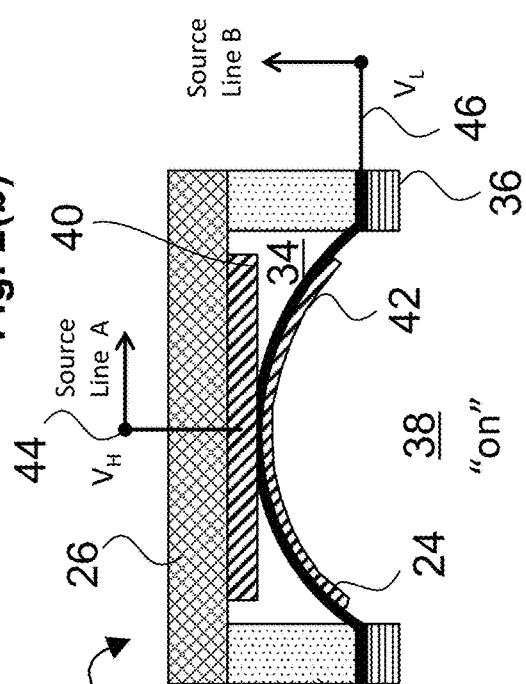
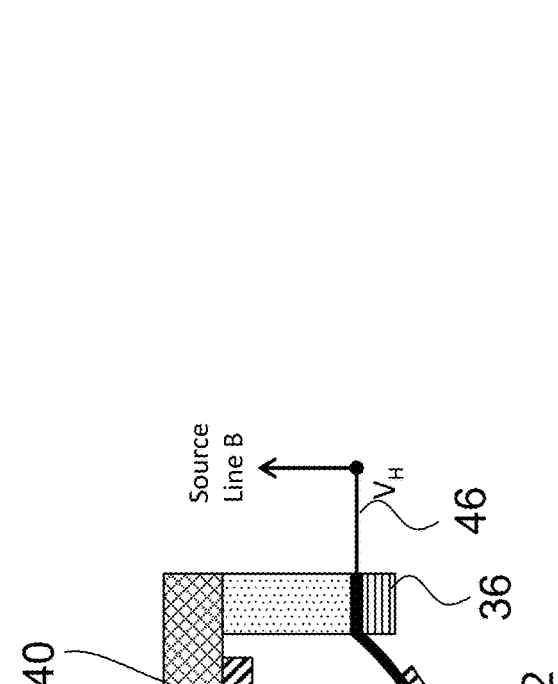
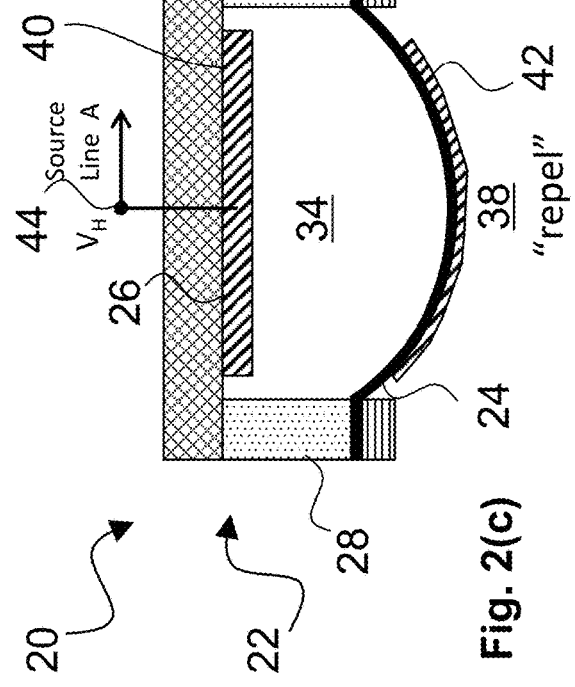
Fig. 2

Fig. 3
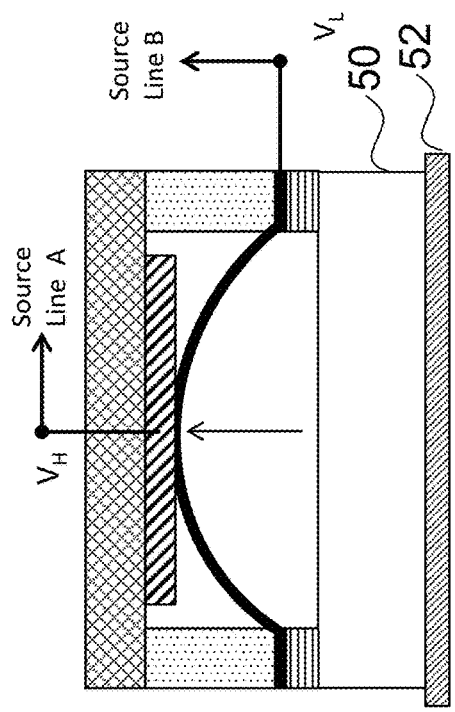
Fig. 3(a)
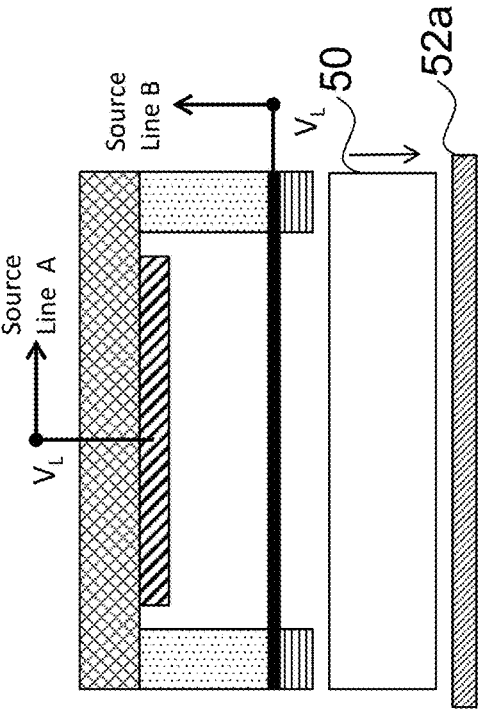
Fig. 3(b)
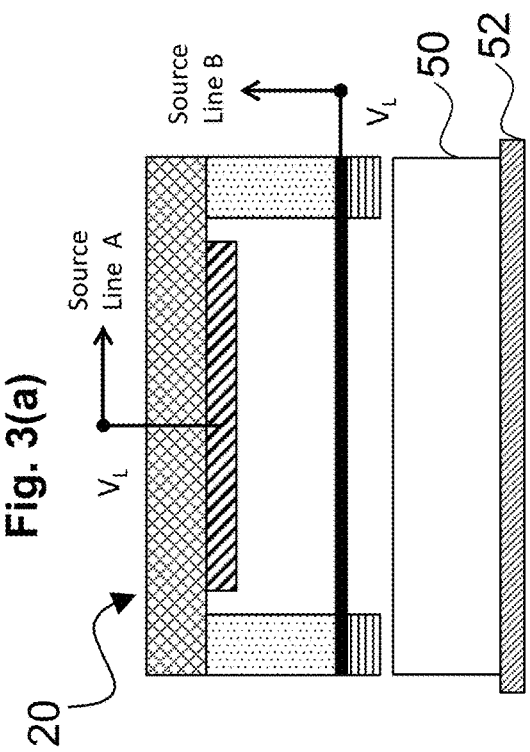
Fig. 3(c)
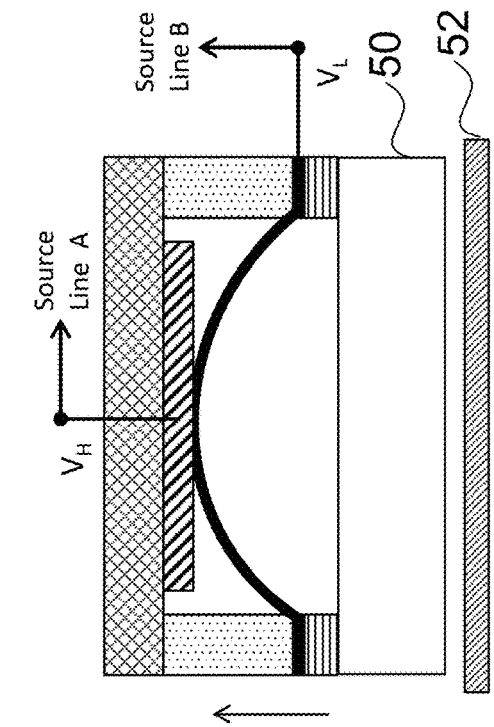
Fig. 3(d)

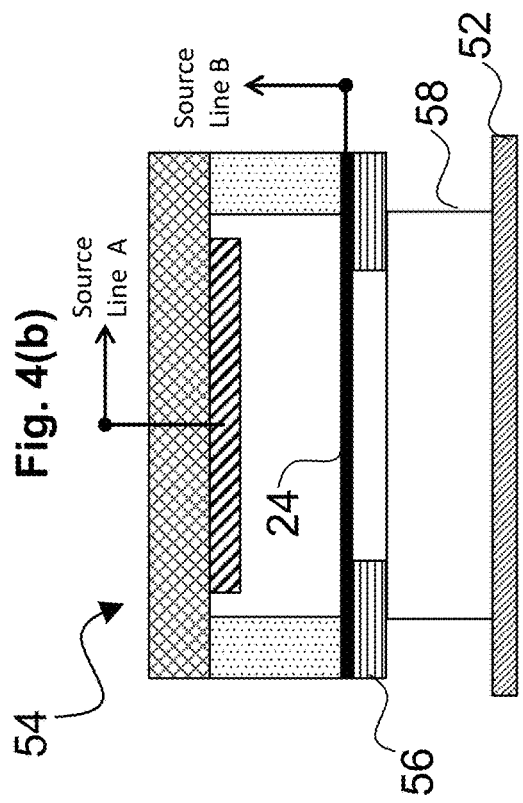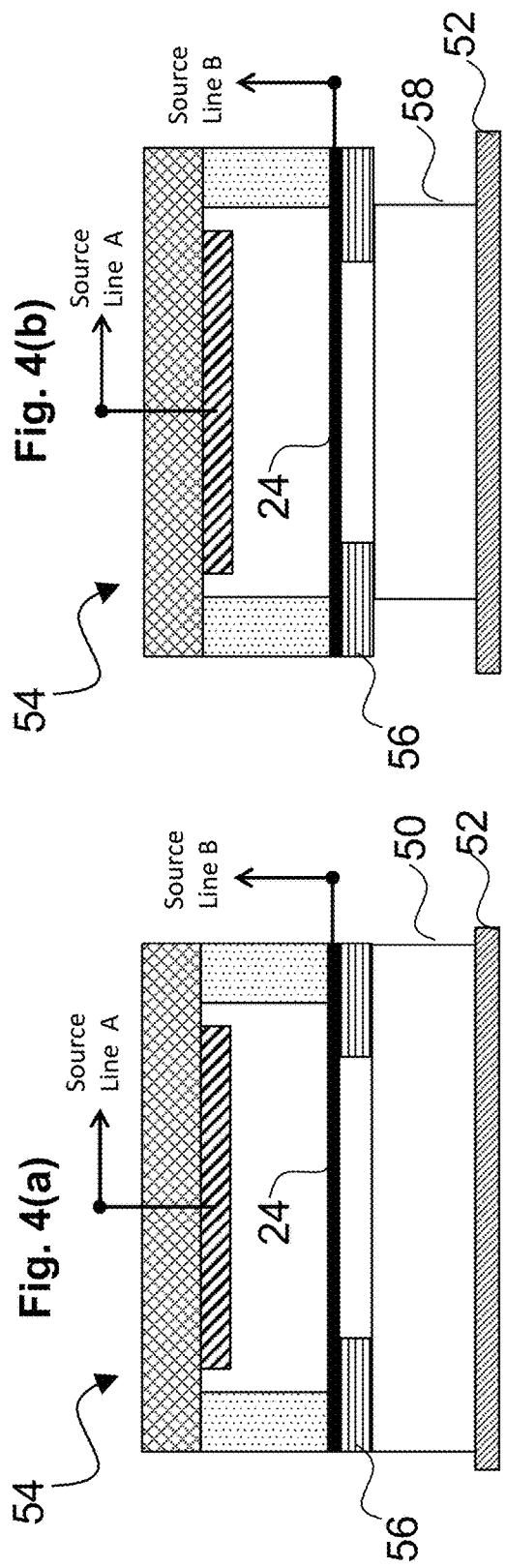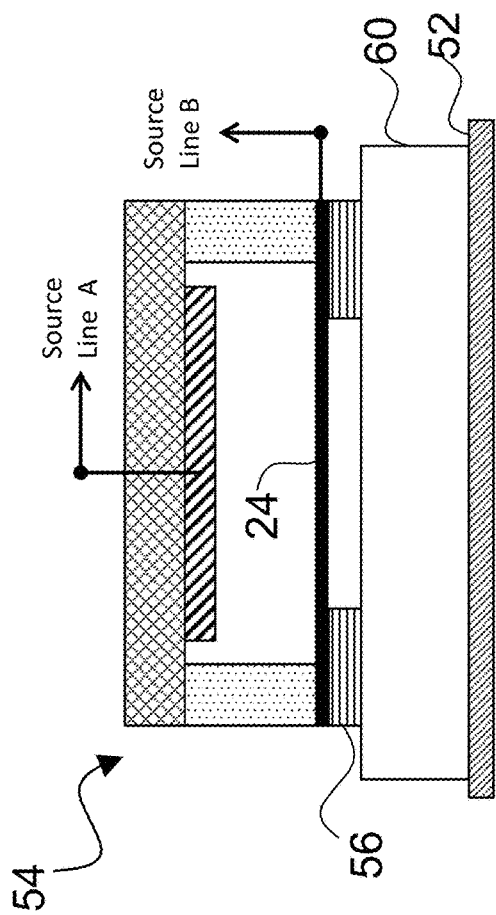

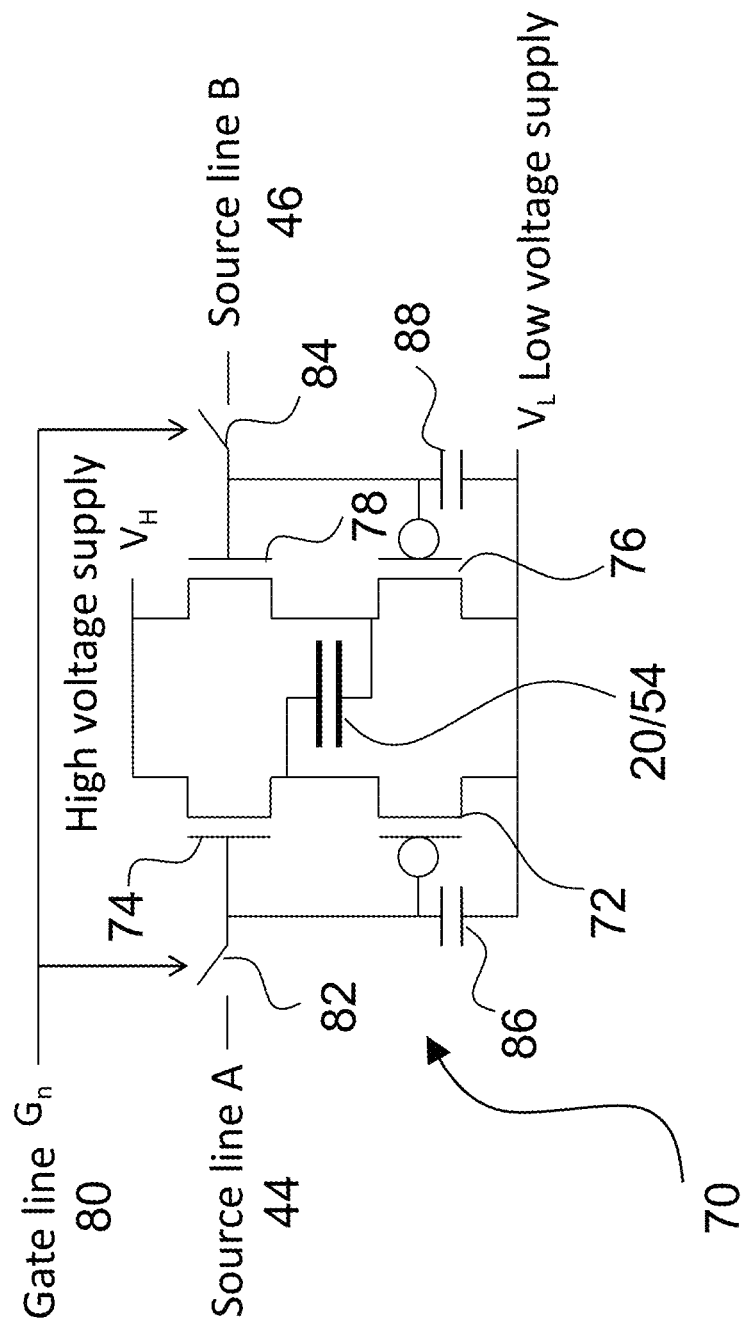

Fig. 6

| State | A | B |
|---|---|---|
| Off | 0 | 0 |
| On (1) | 0 | 1 |
| On (2) | 1 | 0 |
| Repel | 1 | 1 |

MEMS DEVICE AND MANIPULATION METHOD FOR MICRO-OBJECTS

TECHNICAL FIELD

The present invention relates to a micro-transfer device comprising a micro-electromechanical system (MEMS) element capable of manipulating micro-sized objects.

BACKGROUND ART

Micro-electromechanical systems are microscopic devices with moving parts. The use of micro-electromechanical systems (MEMS) involving a flexible membrane, actuated by applying a potential difference between the membrane and an electrode, is well known. These flexible membrane MEMS have mainly been demonstrated in acoustic devices such as a MEMS microphone, or a MEMS ultrasound scanner (e.g., McMullen et al., GB 2469412, published Oct. 13, 2010), both of which involve the acoustic vibration of the flexible membrane.

Efforts in MEMS design have been focused on the design of suitable structures for acoustic generation as well as on the implementation of effective driving methods. For example, Digital Sound Reconstruction (DSR) theory, as described for example in Gabriel et al., US2003/0044029 (published on Mar. 6, 2003) offers low distortion and high linearity to sound production. To be effective, DSR requires a high number of identical speakers that can be individually controlled. Research efforts thus also have focused on the production of miniaturized devices with homogenous and well-tuned properties. In Loeb et al., U.S. Pat. No. 6,829,131B1 (issued Dec. 7, 2004), an acoustic transducer with a diaphragm formed on a single silicon chip using CMOS-MEMS technology is disclosed. With such configuration it is then possible to obtain higher integration and uniformity within an array of devices.

Cohen et al., U.S. Pat. No. 8,780,673B2 (issued Jul. 15, 2014) and Cohen et al., WO2014141258A1 (published Sep. 18, 2014) disclose an actuation system comprised of an array of identical elements constrained to move along one direction and actuated by electromagnetic and electrostatic forces respectively. The single elements are not individually controlled, and a driving method controlled by an active matrix is not disclosed.

In the literature, MEMS structures composed of electrostatically actuated membranes comprising multiple electrodes are reported in the field of RF switches and varactors. Examples of such devices are disclosed in Chou, US2006/0226501A1 (published Oct. 12, 2006), Lan et al., U.S. Pat. No. 8,363,380 (issued Jan. 29, 2013) and Breen et al., U.S. Pat. No. 8,849,087B2 (issued Sep. 30, 2014).

The above fields, however, have offered only limited uses of the capabilities of MEMS devices.

SUMMARY OF INVENTION

The present disclosure describes a device that enables the manipulation of microscale objects by generating forces with MEMS elements that act on the microscale object via the actuation of a flexible membrane. One capability of flexible membrane MEMS, which has not been exploited before, is the generation of attractive forces on the micron scale by the flexing of the membrane. A flexible membrane MEMS can be used to create a form of suction force that can be used to manipulate or move microscale objects.

A field in which such micro-manipulation can be made applicable is the picking up and placing of microscale electronics. For example, micro-manipulation using MEMS attraction forces can be used to aid the assembly of small components on a printed circuit board (PCB). As another example, micro-manipulation using MEMS attraction forces can be used in the transfer of micro light emitting diodes (μLEDs) from a source substrate to a display or target substrate. μLED technology is expected to outperform organic light emitting diodes (OLED) and liquid crystal display (LCD) technologies. Micro-manipulation using MEMS attraction forces could also have applications in biology and chemistry for micro-precision manipulation of small objects such as cells or small amounts of chemicals.

The present invention provides a MEMS element by which a suction force is generated by the actuation of a flexible membrane. In exemplary embodiments, the MEMS element includes a flexible membrane, an electrode configuration for actuating the flexible membrane, and a foot which, when positioned over an object being picked up, creates a clearance region in the form of an air gap above the object. The presence of the clearance region provides clearance space to flex the membrane, and also prevents the membrane from being easily damaged. The clearance region further facilitates actuation for generation of the suction force, as the presence of the clearance region allows for enhanced maintaining of the requisite pressure against the object that is needed for the object to be manipulated. The flexible membrane may be anchored to a casing structure, which may be made of a common MEMS material such as polysilicon. A voltage may be applied to the flexible membrane through an electrode configuration to control the actuation.

The MEMS element may be used to act upon a microscale object via the following process. The MEMS element, in the off state, is positioned above the object; and the foot of the MEMS element is placed on a flat surface of the object, leaving the clearance region air gap between the object and the flexible membrane. The MEMS element is switched to the "on" state by applying a voltage difference across the electrode configuration to deflect the membrane upwards, which reduces the pressure in the clearance region. This reduction in pressure relative to the ambient air pressure creates a suction force acting on the object, and thus the object is retained to the MEMS element by action of the suction force resulting from the negative pressure. At this point the MEMS element may perform a manipulation action on the object, such as picking the object up and moving the object. When the MEMS element is switched to the "off" state by removing the voltage difference across the electrode configuration, the membrane returns to its non-flexed state and the suction force is removed, allowing the object to be released.

An aspect of the invention, therefore, is a micro-electromechanical systems (MEMS) element having a flexible membrane that creates a suction force by flexing to permit manipulation of a microscale object. In exemplary embodiments, the MEMS element includes a casing structure; a flexible membrane attached to the casing structure; and an electrode structure, wherein a voltage applied to the electrode structure causes the flexible membrane to flex relative to the casing structure; wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object. The electrode structure may include a first electrode located on the casing structure and a second electrode associated with the flexible membrane.

Another aspect of the invention is a method of manipulating an object by manipulating the forces applied by the MEMS element. In exemplary embodiments, the method includes placing the MEMS element against the object to be manipulated; applying a voltage to the electrode structure to place the MEMS element in an on state in which the flexible membrane flexes from an initial position to a flexed position relative to the casing structure, whereby the MEMS element generates a suction force against the object by the flexing of the flexible membrane; and retaining the object to the MEMS element by operation of the suction force to perform a manipulation of the object. The method further may include removing the voltage from the electrode structure to place the MEMS element in an off state, whereby the flexible membrane returns to the initial position to remove the suction force. The method further may include applying a voltage to the electrode structure to place the MEMS element in a repel state in which the flexible membrane flexes from the flexed or initial position to an opposite flexed position relative to the on state, whereby the MEMS element generates a repulsion force against the object to release the object from the MEMS element.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 2 is a drawing depicting an exemplary MEMS element in accordance with embodiments of the present invention, with Fig. portions 2(a), 2(b), and 2(c) depicting different actuation states of the MEMS element.

FIG. 3 is a drawing depicting an exemplary method of manipulating an object using the MEMS element in accordance with embodiments of the present invention, with Fig. portions 3(a), 3(b), 3(c), and 3(d) depicting different stages of object manipulation.

FIG. 4 is a drawing depicting another exemplary MEMS element in accordance with embodiments of the present invention, with Fig. portions 4(a), 4(b), and 4(c) depicting manipulations of different sized objects with the MEMS element.

FIG. 5a and FIG. 5b are schematic drawings depicting exemplary TFT drive circuits for driving a MEMS element in accordance with embodiments of the present invention.

FIG. 6 is a chart depicting an operational state of the MEMS element in accordance with voltages being applied to the TFT drive circuit of FIG. 5.

DESCRIPTION OF EMBODIMENTS

Figure 1:
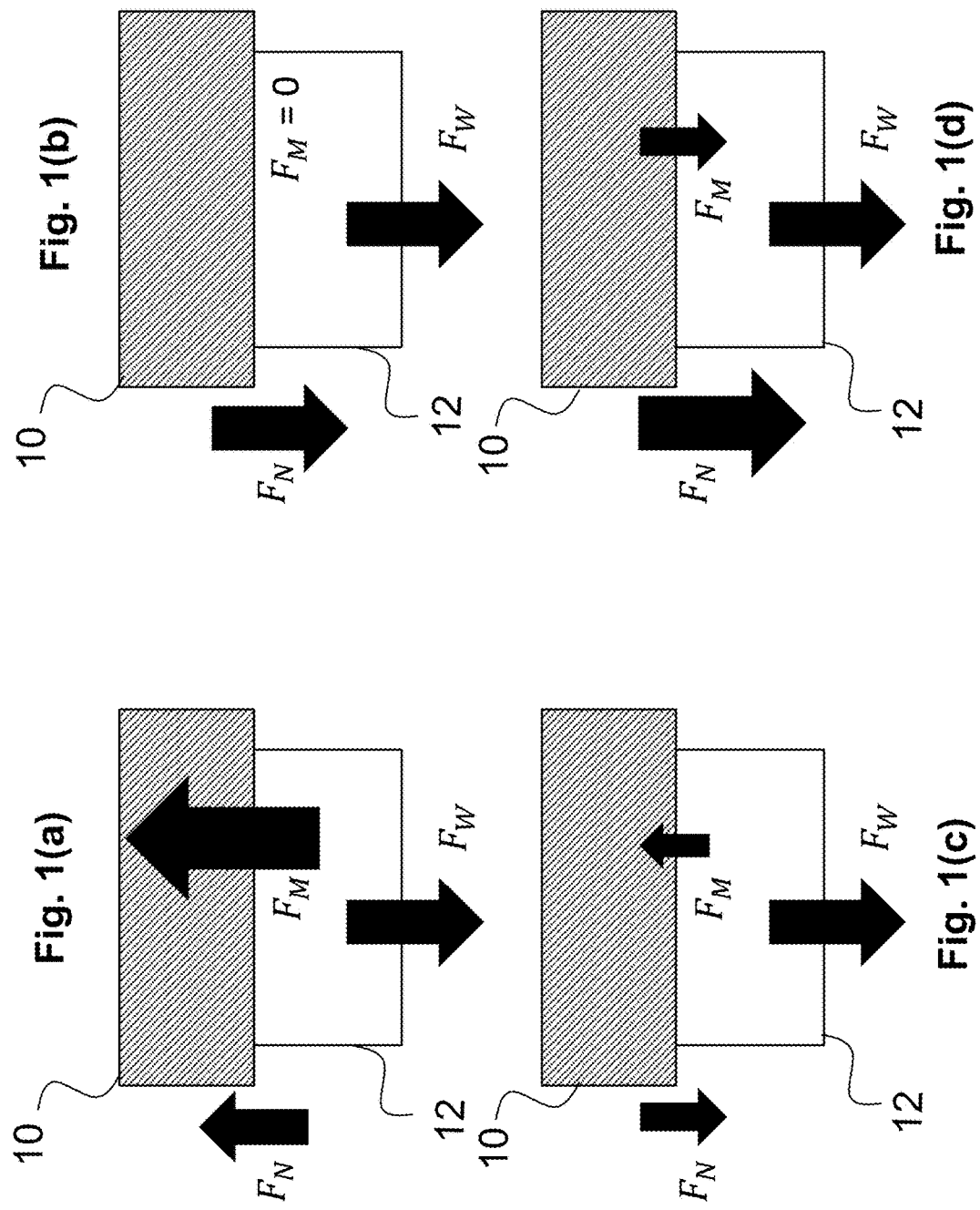
FIG. 1 is a generalized drawing depicting forces that a MEMS element can exert upon a microscale object, with Fig. portions 1(a), 1(b), 1(c), and 1(d) depicting different actuation states of the MEMS element.

Embodiments of the present invention will now be described with reference to the drawings, wherein like reference numerals are used to refer to like elements throughout. It will be understood that the figures are not necessarily to scale.

The present invention provides a MEMS element for the manipulation of microscale objects. FIG. 1 is a generalized drawing depicting forces that a MEMS element 10 can exert upon a microscale object 12, showing the MEMS element 10 in different states of actuation. The MEMS element 10, when actuated creates a force $F_M$ that acts on a microscale object 12. The target on which the MEMS element is acting is referred to herein generally as the "object", which may include various types of microscale objects as further detailed below. The effect of the MEMS force $F_M$ on the object is dependent on the net force $F_N$ of the system, which generally is dependent on how the MEMS force $F_M$ compares with the weight $F_W$ of the object. For the description below, unless stated otherwise it is assumed that these are the main two forces acting in the system; however other external forces may be present in certain uses. Accordingly, more generally the effect of the MEMS element is in accordance with the net force c of the system, which is a net force of the MEMS force $F_M$ and a vector sum of external forces, which may include the weight $F_W$ of the target object.

FIG. 1 depicts a simplified example in which the weight $F_W$ of the object 12 is the only non-negligible external force. In portion FIG. 1(a), the MEMS element is placed in an "on" state such that a MEMS force $f_M$ is generated that exceeds the object weight $F_W$. Accordingly, the net force $F_N$ is in the direction of the MEMS force. In such state, an attractive force is applied to the object that may be used to lift the object and move the object to another location. In portion FIG. 1(b), the MEMS element is placed in an "off" state such that the MEMS force $F_M$ is removed. Accordingly, the net force is in the direction of the object weight $F_W$. In such state, no suction force is applied to the object and the object may not be retained by the MEMS element. Progressing through FIG. 1(a) and FIG. 1(b) illustrates how the object can be picked up (and moved to another location if desired) by actuating the MEMS element to the "on" state, and then releasing the object by de-actuating the MEMS element to the "off" state.

In portion FIG. 1(c), the MEMS element is placed in an "on" state such that a MEMS force $F_M$ is generated that does not exceed the object weight $F_W$. Accordingly, the net force $F_N$ is in the direction of the object weight $F_W$. FIG. 1(c) illustrates that the MEMS force must be sufficient to overcome opposite external forces to manipulate an object, such as for example the weight of the object. In such state, therefore, the suction force applied to the object is not sufficient to lift the object. Progressing through FIG. 1(a) and FIG. 1(c) illustrates how the object can be picked up (and moved to another location if desired) by actuating the MEMS element to the "on" state, and then releasing the object by reducing the MEMS force below the object weight so that the net force $F_N$ is in the direction of the object weight $F_W$, releasing the object. This operation may be employed, for example, to provide a more controlled release of the object.

In portion FIG. 1(d), the MEMS element is placed in a "repel" state such that a MEMS force $F_M$ is generated in the same direction as the object weight $F_W$. Accordingly, the MEMS force is a repulsive force against the object tending to push the object away from the MEMS element. The net force F is in the direction of the object weight $F_W$ and is of a higher magnitude as the net force is a sum of the object weight and the repulsive MEMS force. In such state, therefore, a repulsive force is applied to the object to achieve a strong release of the object. Progressing through FIG. 1(a) and FIG. 1(d) illustrates how the object can be picked up (and moved to another location if desired) by actuating the MEMS element to the "on" state, and then releasing the object by actuating the MEMS element to the "repel" state with a repulsive force so that the net force $F_N$ is stronger in the direction of releasing the object than by simply de-actuating the MEMS element to the "off" state. This operation may be employed, for example, to provide a different type of controlled release of the object by positively pushing the object away from the MEMS element.

Generally, therefore, the MEMS element 10 is capable of generating either an attractive force or a repulsive force when placed in contact with a microscale object 12. In a simple picking up and placing down example, if the attractive force is greater than the weight of the object, this allows the object to be picked up and moved to another location as desired. If the attractive force of the MEMS element is reduced to less than that of the object's weight, the microscale object can be placed down. If the force created by the MEMS element is repulsive, the object will be more positively pushed away from the MEMS element.

An aspect of the invention is a micro-electro-mechanical systems (MEMS) element having a flexible membrane that creates a suction force by flexing to permit manipulation of a microscale object. In exemplary embodiments, the MEMS element includes a casing structure; a flexible membrane attached to the casing structure; and an electrode structure, wherein a voltage applied to the electrode structure causes the flexible membrane to flex relative to the casing structure; wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object. The electrode structure may include a first electrode located on the casing structure and a second electrode associated with the flexible membrane.

FIG. 2 is a drawing depicting an exemplary MEMS element 20 in accordance with embodiments of the present invention, and showing the MEMS element 20 in different states of actuation. MEMS element 20 generates the MEMS force referenced above by actuation of a flexible membrane. The MEMS element 20 includes a casing structure 22 into which there is anchored a flexible membrane 24. In the example of FIG. 2, the casing structure 22 is formed of a plurality of separate components. The casing structure components may include a substrate 26 and a casing wall 28 that extends from the substrate 26. The substrate 26 may be made of a variety of rigid plastic materials or the like, including for example silicon, polysilicon, nitride or a flexible polymer. The casing wall 28 may be made of a comparable material as the substrate, and may be made of the same material or a different material as the substrate, and polysilicon is particularly suitable for the casing wall. In addition, although the substrate 26 and casing wall 28 are shown as separate components, they may be formed as a unitary or single piece of a same material.

The membrane 24 may be made of a comparable material as the components of the casing structure 22, and sufficiently thin so as to be rendered flexible. Polysilicon likewise is a particularly suitable material for the membrane 24. The membrane 24 includes an end anchor portion 30 and a more central flexing portion 32. The membrane 24 is deposited onto the casing wall 28 with the membrane being fixed at the anchor portion 30 to the casing wall 28 opposite from the substrate 26. The flexing portion 32 extends out of contact with the casing wall 28 to permit flexing of the flexing portion 32. As seen in FIG. 2, the membrane 24 and the casing structure 22 define a gap 34 into which the flexing portion 32 of the membrane may flex when the MEMS device is actuated.

The membrane 24 further is anchored in place by a foot 36 that extends from the flexible membrane in a direction away from the casing structure. The foot 36 is deposited on the anchor portion 30 of the membrane 24 so that the anchor portion 30 is securely fixed between the casing wall 28 and the foot 36. The foot 36 may be made of a material comparably as the material of the casing wall 28 and/or substrate 26, and suitable materials include, for example, polysilicon and polydimethylsiloxane (PDMS). The foot 36 also may include an adhesive material so as to adhere to an object to be manipulated. The adhesive material may be incorporated generally into the foot material, such as by forming the foot using a polymer material having adhesive properties. Alternatively, the foot may include an adhesive layer or film on a surface of the foot that contacts the object to be manipulated. Positioning of the foot 36 results in the foot and the flexible membrane defining a clearance region 38 on an opposite side of the membrane 24 from the gap 34. As further detailed below, when the MEMS element 20 interacts with an object, the foot 36 spaces the membrane 24 apart from the object to be manipulated by an amount of the clearance region 38. The presence of the clearance region 38 makes it easier to flex the membrane and also prevents the membrane from being easily damaged.

The MEMS element 20 further may include an electrode structure for applying a voltage to the MEMS element 20. In an exemplary embodiment, a configuration of the electrode structure may include a first electrode located on the casing structure 22 and a second electrode located on the membrane 24, for actuating the MEMS device 20, particularly by flexing the membrane 24. Voltages applied to the first and second electrodes cause the flexible membrane to flex relative to the casing structure, as described in more detail below. The electrode configuration may include a first electrode 40 located on the substrate 26 of the casing 22 (also referred to as a casing electrode), and a second electrode 42 located on the membrane 24 (also referred to as a membrane electrode). The membrane electrode 42 may be deposited on or incorporated within or as part of the membrane 24. For simplicity of the drawings, therefore, the membrane electrode 42 is omitted from some of the subsequent drawings, although it will be appreciated that a membrane electrode is electrically associated or connected in some fashion to the MEMS device in association with the membrane 24 so as to be able to actuate and flex the membrane. Voltages are applied to the casing electrode 40 and the membrane electrode 42 to generate a potential difference between the substrate 26 and the membrane 24, which can cause the membrane to flex relative to an unactuated initial position of the membrane. For applying the voltages, the casing electrode 40 is electrically connected to a first voltage source line 44 (referred to as source line A), and the membrane electrode 42 is electrically connected to a second voltage source line 46 (referred to as source line B). The electrodes are made of any suitable metal material or other conductive material (such as a metal alloy for example) known in the art for electrode applications. In addition, although a two-electrode configuration is suitable, in another exemplary embodiment the electrode structure may include only a single electrode applied to the casing structure, as shown in some of the subsequent figures.

The portions of FIG. 2 illustrate the MEMS element 20 in different states of actuation. As further detailed below, when voltages are applied to the first and second electrodes in a manner that renders the electrodes oppositely charged, the flexible membrane is in an "on" state and flexes in a direction toward a substrate of the casing structure. When voltages are not applied to the first and second electrodes, the flexible membrane is in an "off" state and the flexible membrane does not flex relative to an initial position corresponding to when no voltage is applied to the flexible membrane. When voltages are applied to the first and second electrodes in a manner that renders the electrodes commonly charged, the flexible membrane is in a "repel" state and flexes in a direction away from the substrate of the casing structure In portion FIG. 2(a), no voltages are applied to the electrodes 40 and 42, and the MEMS device 20 is in an unactuated "off" state. In such state, the membrane 24 is at an initial position at which the membrane is positioned as anchored to the casing structure 22, i.e., the initial position is the membrane position in the "off" state corresponding to when no voltage is applied to the flexible membrane.

In portion FIG. 2(b), voltages are applied to the electrodes 40 and 42 via source line A and source line B, and the MEMS device 20 is in an actuated "on" state. The term "actuated state" or "on" state refers to the membrane flexing through the gap 34 towards the substrate 26 of the casing structure 22. This is accomplished by applying the voltages on the source lines to generate a potential difference between the substrate of the casing structure and the flexible membrane, whereby the flexible membrane becomes electrically attracted to the substrate. The result of said electrical attraction is that the membrane 24 flexes toward the substrate 26. FIG. 2(b) illustrates essentially a maximum state of flexion of the membrane 24 to generate a maximum suction force on the object. The voltages for source lines A and B, and therefore the level of attractive force and resultant flexion of the membrane, may be adjusted as is suitable to generate the desired flexion and resultant attractive MEMS force as described above with reference to FIG. 1(c).

In portion FIG. 2(c), voltages are applied to the electrodes 40 and 42 via source line A and source line B, and the MEMS device 20 is in a repel state. The term "repel state" refers to the membrane flexing through the clearance region 38 away from the substrate 26 of the casing structure 22. This accomplished by applying the voltages from the source lines to generate a potential between the casing structure and the flexible membrane whereby the flexible membrane becomes electrically repulsive from the substrate of the casing structure. The result of the electrical repulsion between the flexible membrane and the substrate is that the membrane 24 flexes away from the substrate 26. The voltages for source lines A and B, and therefore the level of repulsive force and resultant flexion of the membrane, also may be adjusted as is suitable to generate the desired flexion and resultant repulsive MEMS force comparably as with the "on" state.

FIG. 3 is a drawing depicting an exemplary method of manipulating an object using the MEMS element 20 in accordance with embodiments of the present invention, and showing different stages of object manipulation. FIG. 3 shows the MEMS element 20 in relation to a microscale object 50 to be manipulated that initially is located on a support surface 52. The support surface 52 may be any suitable surface for locating the object 50, such as a substrate material, table, electronic wafer material, or the like.

Generally, an aspect of the invention is a method of manipulating an object by manipulating the forces applied by the MEMS element. In exemplary embodiments, the method includes placing the MEMS element against the object to be manipulated; applying a voltage to the electrode structure to place the MEMS element in an on state in which the flexible membrane flexes from an initial position to a flexed position relative to the casing structure, whereby the MEMS element generates a suction force against the object by the flexing of the flexible membrane; and retaining the object to the MEMS element by operation of the suction force to perform a manipulation of the object. The method further may include removing the voltage from the electrode structure to place the MEMS element in an off state, whereby the flexible membrane returns to the initial position to remove the suction force. The method further may include applying a voltage to the electrode structure to place the MEMS element in a repel state in which the flexible membrane flexes from the flexed or initial position to an opposite flexed position relative to the on state, whereby the MEMS element generates a repulsion force against the object to release the object from the MEMS element.

Referring to FIG. 3, the MEMS element 20 may be used to act upon an object 50 via the following process, as illustrated in the portions of FIG. 3. In portion FIG. 3(a), the MEMS element 20 is in the "off" state, i.e., no voltages are applied to the electrodes so the membrane 24 is not flexed relative to the initial position. In such "off" state, the MEMS element 20 is positioned above the object 50. In a transition from portion FIG. 3(a) to portion FIG. 3(b), the foot 36 of the MEMS element is placed on a flat surface of the object 50, leaving the clearance region 38 between the object 50 and the flexible membrane 24. As depicted in portion FIG. 3(b), the MEMS element 20 is switched to the "on" state by applying voltages to the casing and membrane electrodes to generate an attractive force between the membrane and the substrate, thereby deflecting the membrane 24 though the gap 34 towards the substrate 26. This in turn results in a reduced pressure in the clearance region 38 relative to ambient pressure between the membrane 24 and the object 50. This reduction in pressure within the clearance region 38 relative to the ambient air pressure creates a suction force acting on the object 50, by which the object 50 is retained to the foot 36 of the MEMS element 20 via the negative pressure.

As depicted in portion FIG. 3(c), the MEMS element may perform a manipulation action on the object 50. In a basic manipulation action, the object 50 may be lifted off of or picked up from the support surface 52. The MEMS element 20 may then be moved to another location, and the MEMS force is retained to carry the object 50 along with the movement of the MEMS element 20. As depicted in portion FIG. 3(d), when the MEMS element is switched back to the "off" state (i.e., the voltages are removed from the electrodes), the membrane returns to its non-flexed initial position and the suction MEMS force is thereby removed. In absence of the suction MEMS force, the object 50 is released, allowing the object to be placed upon a support surface 52(a). With movement of the MEMS element 20 while the suction force is applied, the surface 52(a) may be a different location on the same support surface 52 from which the object 50 originated, or support surface 52(a) may be located on a wholly different structure from the support surface 52. In this manner, the MEMS element 20 may move microscale objects to different locations by application of the MEMS suction force.

When employed to pick up and move a microscale object, the design parameters of the MEMS element 20, such as for example, size, applicable electrode voltages, membrane flexing range, and the like may be set such that the actuation of the MEMS element creates enough MEMS suction force to be able to overcome the weight of the object desired to be picked up and moved. For example, a gallium nitride cube of sides 10 μm could be easily picked up by a MEMS element described above with a width of 10 μm and a membrane that is allowed to deflect upwards by 0.5 μm. The MEMS element 20 may be specially configured in this manner for manipulating a given microscale object.

Generally, therefore, a field in which such micro-manipulation can be made applicable is the picking up and placing of microscale electronics. For example, micro-manipulation using MEMS attraction forces can be used to aid the assembly of small components on a printed circuit board (PCB). As another example, micro-manipulation using MEMS attraction forces can be used in the transfer of micro light emitting diodes (μLEDs) from a source substrate to a display or target substrate. μLED technology is expected to outperform organic light emitting diodes (OLED) and liquid crystal display (LCD) technologies. Micro-manipulation using MEMS attraction forces could also have applications in biology and chemistry for micro-precision manipulation of small objects such as cells or small amounts of chemicals.

As referenced above, the foot 36 of the MEMS element 20 may include an adhesive material so as to adhere to the object 50 to be manipulated. The combination of adhesive properties of the foot 36 with the suction force of the MEMS element 20 provides an enhanced seal with the object 50 so that the MEMS suction force is more effective in retaining the object 50. If an adhesive material is incorporated into the foot 36, the object 50 might not be released when the membrane is returned to the non-flexed state of FIG. 3(d). In this embodiment, therefore, if the MEMS element were to be placed in the "off" state from the "on" state, the object still may be retained by the MEMS element by operation of the adhesive material. The MEMS element is therefore placed in the repel state to release the object from the MEMS element. Referring to FIG. 2, the MEMS element 20 is switched to the repel state of FIG. 2(c) (i.e., the source voltages render the membrane and casing electrodes to be like charges). By switching the MEMS element from the "on" state (or "off" state) to the "repel" state, the membrane 24 flexes in an opposite direction away from the substrate 26 into the clearance region 38. This in turn raises the air pressure within the clearance region 38 relative to ambient air pressure, which pushes the object off from the foot 36 of the MEMS element 20. In this manner, an adhesive foot provides a more stable retention of the object to the MEMS element during object manipulation, and the repel state then can be used to aid releasing the object in a more controlled manner.

FIG. 4 is a drawing depicting another exemplary MEMS element 54 in accordance with embodiments of the present invention, and further depicting manipulations of different sized objects with the MEMS element 54. MEMS element 54 bears similarities to the previous embodiments, and thus like components are afforded like reference numerals. The embodiment of FIG. 4 differs in that the extended foot 56 is provided that extends inward into the clearance region 38 relative to the casing wall 28.

With such configuration, the MEMS element 54 may act upon a range of different sized objects. Portion FIG. 4(a) shows that the foot 56 can interact against objects 50 comparable in size to the previous embodiment. In addition, as shown in portion FIG. 4(b), the extended foot 56 of the MEMS element 54 is configured such that objects 58 smaller than the dimensions of the MEMS element 54 can be manipulated, so long as some portion of the foot is in contact with the surface of the smaller object 58 to be picked up. This is achieved by the inward extending configuration of the foot 56 by which a portion of the foot overlaps with the central portion of the membrane 24. In addition, as shown in portion FIG. 4(c), objects 60 larger than the dimensions of the MEMS element 54 can be acted upon easily since the extended foot 56 will rest on a larger portion of the surface of the larger object 60 as compared to the previous embodiment.

The configuration of MEMS element 54 depicted in FIG. 4 may reduce the amount of suction force that can be generated by the MEMS element, insofar as the volume of the clearance region 38 is reduced by the use of the extended foot 56. Accordingly, the dimensions of the foot may be configured to properly balance or establish a useful trade-off of the force needs versus object size range for any particular application.

Figure 5B:
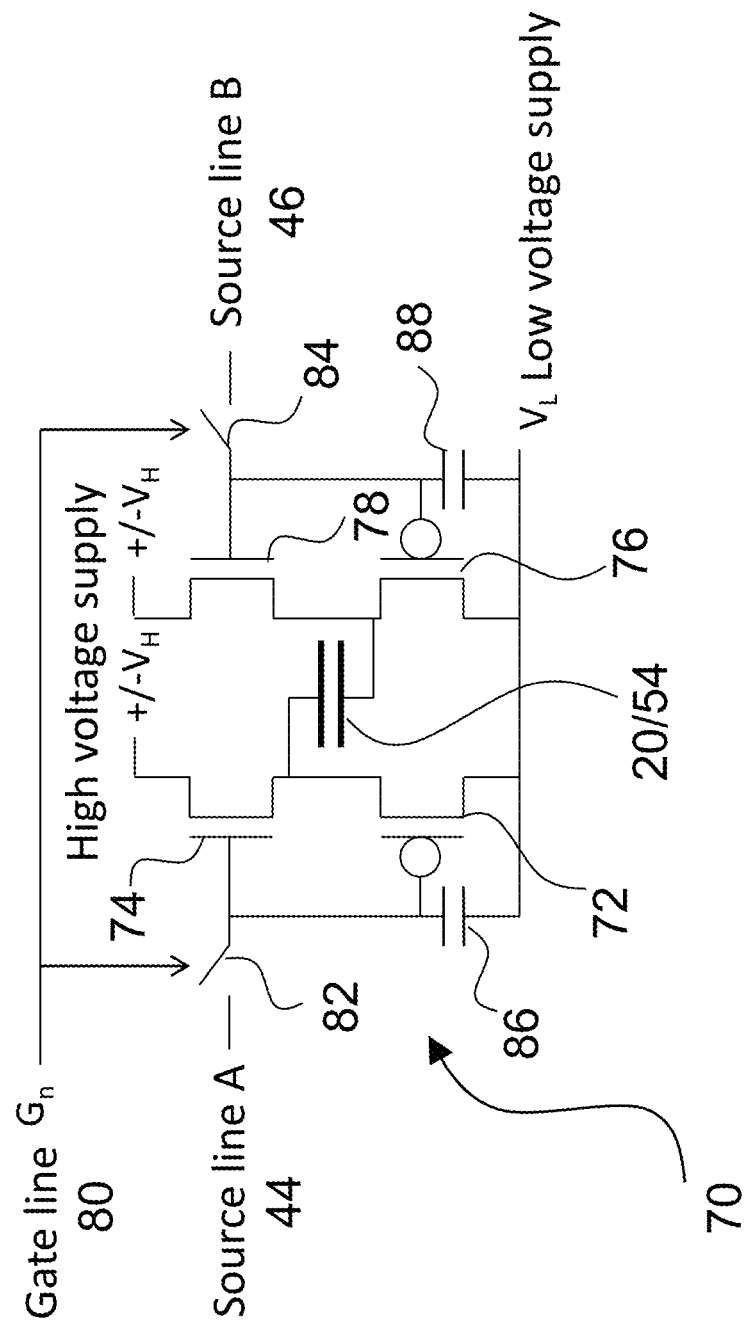

FIGS. 5a and 5b are schematic drawings depicting an exemplary TFT drive circuit 70 for driving a MEMS element 20/54 in accordance with embodiments of the present invention, which operates by controlling voltages applied to the first and second electrodes. As referenced above, source line A 44 is electrically connectable to the first (casing) electrode 40 of the MEMS element, and source line B 46 is connectable to the second (membrane) electrode 42 of the MEMS element.

The drive circuit 70 may include one or more transistors, which may be TFT transistors. In an exemplary implementation of the TFT drive circuit 70, source line A is connectable to a first p-type transistor 72 and a first n-type transistor 74 that are electrically connected to the first electrode of the MEMS element 20/54. Similarly, source line B is connectable to a second p-type transistor 76 and a second n-type transistor 78 that are electrically connected to the second electrode of the MEMS element 20/54. Each of the source lines A and B may be operated as a high voltage supply $V_H$ or a low voltage supply $V_L$, which may be external voltage supplies. It will be appreciated that a high voltage $V_H$ or a low voltage $V_L$ corresponds to a respective threshold voltage for switching the transistor elements, such that a transistor state will switch at any voltage of magnitude above $V_H$ or below $V_L$. The low voltage may be a ground voltage of 0 V. A gate line 80 ($G_n$) may be operated to close switches 82 and 84 to connect the respective source lines to the drive circuit 70 such that the voltages from the source lines may be applied to respective electrodes of the MEMS element. When multiple MEMS elements are configured in a two-dimensional array, the gate line 80 operates to select a row of MEMS elements, and connects the source lines to selected MEMS elements for actuation by application of the source line voltages.

The drive circuit further may include one or more memory elements for storing voltages applied to the first electrode and the second electrode. In the example of FIG. 5a, the one or more memory elements includes a first capacitor 86 that stores a voltage applied to the first electrode, and a second capacitor 88 that stores a voltage applied to the second electrode. Capacitors 86 and 88 operate as DRAM memory storage elements so that the voltage remains applied to the MEMS element even after the gate line is switched off. This means the next row of elements can be addressed without losing the voltage states of the current row of elements. SRAM elements alternatively may be employed, although SRAM elements tend to be bulkier than DRAM elements, so DRAM elements would be preferred.

An alternative drive circuit arrangement is shown in FIG. 5b. With such configuration, each electrode may be supplied by a separate high voltage supply, and each high voltage supply may be switched between either a positive or negative voltage as desired.

Figure 6:
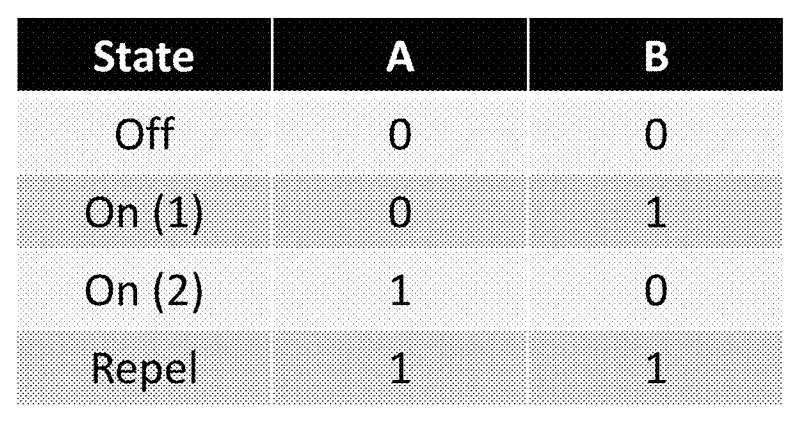

FIG. 6 is a chart depicting an operational state of the MEMS element in accordance with voltages being applied via the TFT drive circuit of FIG. 5a or FIG. 5b. In such chart, a "0" state is associated with a low voltage condition (e.g., voltage magnitude below the $V_L$ threshold), and a "1" state is associated with a high voltage condition (e.g., voltage magnitude above the $V_H$ threshold). As seen in the chart, when the source line voltages A and B are taken low, the MEMS element is the "off" state as no operating voltages are being applied to the MEMS element. When the source line voltages differ, e.g., source line A is low and source line B is high, or vice versa, the MEMS element is in the "on" state. In other words, with the source line voltages opposing high versus low, a potential difference is created to generate the attractive force to flex the MEMS membrane to generate the negative pressure suction force of the "on" state. Referring to the specific states identified in FIG. 6, the difference between the On(1) and On(2) states is the relative voltage applied to the electrodes, i.e., which electrode is high versus which electrode is low depending upon which source line is high versus which source line is low. In both states, however, the MEMS element is in the "on" state as the attractive force is generated by the potential difference between the flexible membrane and the substrate. When the source line voltages are both taken high, the MEMS element is in the "repel" state. In other words, the source line voltages being both high are applied to generate the repulsive force to flex the MEMS membrane to generate the positive pressure release force of the repel state.

An aspect of the invention, therefore, is a micro-electro-mechanical systems (MEMS) element having a flexible membrane that creates a suction force by flexing to permit manipulation of a microscale object. In exemplary embodiments, the MEMS element includes a casing structure; a flexible membrane attached to the casing structure; an electrode structure, wherein voltages applied to the electrode structure cause the flexible membrane to flex relative to the casing structure; wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap. When the MEMS element interacts with an object to be manipulated the foot spaces the membrane apart from the object. The MEMS element may include one or more of the following features, either individually or in combination.

In an exemplary embodiment of the MEMS element, the flexible membrane is fixed at an anchor portion between the casing structure and the foot.

In an exemplary embodiment of the MEMS element: the electrode structure includes a first electrode located on the casing and a second electrode associated with the flexible membrane; the casing structure comprises a substrate and a casing wall that extends from the substrate; the first electrode is deposited on the substrate; and the flexible membrane is attached to a surface of the casing wall opposite from the substrate.

In an exemplary embodiment of the MEMS element, the substrate and the casing wall are made of different materials.

In an exemplary embodiment of the MEMS element, the substrate and the casing wall comprise a single piece of a same material.

In an exemplary embodiment of the MEMS element, the foot extends inward from the casing wall along the flexible membrane.

In an exemplary embodiment of the MEMS element, the foot includes an adhesive material.

In an exemplary embodiment of the MEMS element, when a voltage is applied to the electrode structure to generate an attractive force between the flexible membrane and a substrate of the casing structure, the flexible membrane is in an on state and flexes in a direction toward the substrate of the casing structure; and when a voltage is not applied to the electrode structure, the flexible membrane is in an off state and the flexible membrane does not flex relative to an initial position.

In an exemplary embodiment of the MEMS element, when a voltage is applied to the electrode structure in a manner that renders the flexible membrane electrically repulsive relative to the substrate of the casing structure, the flexible membrane is in a repel state and flexes in a direction away from the substrate of the casing structure.

In an exemplary embodiment of the MEMS element, the MEMS element further includes a drive circuit for controlling voltages applied to the electrode structure.

In an exemplary embodiment of the MEMS element, the drive circuit includes one or more transistors.

In an exemplary embodiment of the MEMS element, the one or more transistors includes a first p-type transistor and a first n-type transistor that are electrically connected to a first electrode located on the casing structure, and a second p-type transistor and a second n-type transistor that are electrically connected to a second electrode associated with the flexible membrane.

In an exemplary embodiment of the MEMS element, the one or more transistors are TFT transistors.

In an exemplary embodiment of the MEMS element, the drive circuit further comprises one or more memory elements for storing voltages applied to the electrode structure.

In an exemplary embodiment of the MEMS element, the one or more memory elements includes a first capacitor that stores a voltage applied to a first electrode located on the casing structure, and a second capacitor that stores a voltage applied to a second electrode associated with the flexible membrane.

Another aspect of the invention is a method of manipulating an object using a micro-electro-mechanical systems (MEMS) element. In exemplary embodiments the method includes the steps of: providing a MEMS element according to any of the embodiments; placing the MEMS element against the object to be manipulated; applying a voltage to the electrode structure to place the MEMS element in an on state in which the flexible membrane flexes from an initial position to a flexed position relative to the casing structure, whereby the MEMS element generates a suction force against the object by the flexing of the flexible membrane; and retaining the object to the MEMS element by operation of the suction force to perform a manipulation of the object. The method of manipulating an object may include one or more of the following features, either individually or in combination.

In an exemplary embodiment of the method of manipulating an object, the method further includes removing the voltage from the electrode structure to place the MEMS element in an off state, whereby the flexible membrane returns to the initial position to remove the suction force.

In an exemplary embodiment of the method of manipulating an object, the method further includes applying a voltage to the electrode structure to place the MEMS element in a repel state in which the flexible membrane flexes from the flexed or initial position to an opposite flexed position relative to the on state, whereby the MEMS element generates a repulsion force against the object to release the object from the MEMS element.

In an exemplary embodiment of the method of manipulating an object, the foot further includes an adhesive material for adhering the MEMS element to the object; when the MEMS element is placed in the off state from the on state, the object is retained by the MEMS element by operation of the adhesive material; and the MEMS element is placed in the repel state to release the object from the MEMS element.

In an exemplary embodiment of the method of manipulating an object, performing the manipulation of the object comprises: using the suction force to lift the object from a first surface; moving a location of the object while the suction force retains the object to the MEMS element; and removing the suction force and releasing the object from the MEMS element, thereby placing the object on a second surface.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention may be utilized for the manipulation of microscale objects. Fields in which such micro-manipulation can be made applicable is the picking up and placing of microscale electronics. For example, micro-manipulation using MEMS attraction forces can be used to aid the assembly of small components on a printed circuit board (PCB). As another example, micro-manipulation using MEMS attraction forces can be used in the transfer of micro light emitting diodes (µLEDs) from a source substrate to a display or target substrate. Micro-manipulation using MEMS attraction forces could also have applications in biology and chemistry for micro-precision manipulation of small objects such as cells or small amounts of chemicals.

REFERENCE SIGNS LIST

10—MEMS element
12—microscale object
20—MEMS element
22—casing structure
24—flexible membrane
26—substrate
28—casing wall
30—end anchor portion
32—central flexing portion
34—gap
36—foot
38—clearance region
40—first electrode, casing electrode
42—second electrode, membrane electrode
44—first voltage source line/source line A
46—second voltage source line/source line B
50—microscale object
52—support surface
52(a)—support surface
54—MEMS element
56—foot
58—object to be manipulated
60—objects
70—TFT drive circuit
72—first p-type transistor
74—first n-type transistor
76—second p-type transistor
78—second n-type transistor
80—gate line
82—switch
84—switch
86—first capacitor
88—second capacitor

What is claimed is:

1. A micro-electro-mechanical systems (MEMS) element comprising:
    a casing structure;
    a flexible membrane attached to the casing structure;
    an electrode structure, wherein voltages applied to the electrode structure cause the flexible membrane to flex relative to the casing structure;
    wherein the flexible membrane and the casing structure define a gap into which the flexible membrane may flex; and
    a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object;
    wherein the clearance region is open oppositely from the flexible membrane.

2. The MEMS element of claim 1, wherein the flexible membrane is fixed at an anchor portion between the casing structure and the foot.

3. The MEMS element of claim 1, wherein:
    the electrode structure includes a first electrode located on the casing and a second electrode associated with the flexible membrane;
    the casing structure comprises a substrate and a casing wall that extends from the substrate;

the first electrode is deposited on the substrate; and
the flexible membrane is attached to a surface of the casing wall opposite from the substrate.

4. The MEMS element of claim 3, wherein the substrate and the casing wall are made of different materials.

5. The MEMS element of claim 3, wherein the substrate and the casing wall comprise a single piece of a same material.

6. The MEMS element of claim 1, wherein the foot extends inward from the casing wall along the flexible membrane.

7. The MEMS element of claim 1, wherein when a voltage is applied to the electrode structure to generate an attractive force between the flexible membrane and a substrate of the casing structure, the flexible membrane is in an on state and flexes in a direction toward the substrate of the casing structure; and
when a voltage is not applied to the electrode structure, the flexible membrane is in an off state and the flexible membrane does not flex relative to an initial position.

8. The MEMS element of claim 7, wherein when a voltage is applied to the electrode structure in a manner that renders the flexible membrane electrically repulsive relative to the substrate of the casing structure, the flexible membrane is in a repel state and flexes in a direction away from the substrate of the casing structure.

9. The MEMS element of claim 1, further comprising a drive circuit for controlling voltages applied to the electrode structure.

10. The MEMS element of claim 9, wherein the drive circuit includes one or more transistors.

11. The MEMS element of claim 10, wherein the one or more transistors includes a first p-type transistor and a first n-type transistor that are electrically connected to a first electrode located on the casing structure, and a second p-type transistor and a second n-type transistor that are electrically connected to a second electrode associated with the flexible membrane.

12. The MEMS element of claim 10, wherein the one or more transistors are TFT transistors.

13. The MEMS element of claim 9, wherein the drive circuit further comprises one or more memory elements for storing voltages applied to the electrode structure.

14. The MEMS element of claim 13, wherein the one or more memory elements includes a first capacitor that stores a voltage applied to a first electrode located on the casing structure, and a second capacitor that stores a voltage applied to a second electrode associated with the flexible membrane.

15. A micro-electro-mechanical systems (MEMS) element comprising:
a casing structure;
a flexible membrane attached to the casing structure;
an electrode structure, wherein voltages applied to the electrode structure cause the flexible membrane to flex relative to the casing structure;
wherein the flexible membrane and the casing structure define a gap into which the flexible membrane may flex; and
a foot extending from the flexible membrane in a direction away from the casing structure, wherein the foot and the flexible membrane define a clearance region on an opposite side of the flexible membrane from the gap, and when the MEMS element interacts with an object to be manipulated the foot spaces the membrane apart from the object;
wherein an outer surface of the foot opposite from the flexible membrane includes an adhesive material.

16. A method of manipulating an object using a micro-electro-mechanical systems (MEMS) element comprising the steps of:
providing a MEMS element including: a casing structure; a flexible membrane attached to the casing structure; an electrode structure, wherein the flexible membrane and the casing structure define a gap into which the flexible membrane may flex; and a foot extending from the flexible membrane in a direction away from the casing structure, wherein the foot and the flexible membrane define a clearance region on an opposite side of the flexible membrane from the gap, and when the MEMS element is placed on the object the foot spaces the membrane apart from the object;
placing the MEMS element against the object to be manipulated;
applying a voltage to the electrode structure to place the MEMS element in an on state in which the flexible membrane flexes from an initial position to a flexed position relative to the casing structure, whereby the MEMS element generates a suction force against the object by the flexing of the flexible membrane; and
retaining the object to the MEMS element by operation of the suction force to perform a manipulation of the object.

17. The method of manipulating an object of claim 16, further comprising removing the voltage from the electrode structure to place the MEMS element in an off state, whereby the flexible membrane returns to the initial position to remove the suction force.

18. The method of manipulating an object of claim 16, further comprising applying a voltage to the electrode structure to place the MEMS element in a repel state in which the flexible membrane flexes from the flexed or initial position to an opposite flexed position relative to the on state, whereby the MEMS element generates a repulsion force against the object to release the object from the MEMS element.

19. The method of manipulating an object of claim 18, wherein:
the foot further includes an adhesive material for adhering the MEMS element to the object;
when the MEMS element is placed in the off state from the on state, the object is retained by the MEMS element by operation of the adhesive material; and
the MEMS element is placed in the repel state to release the object from the MEMS element.

20. The method of manipulating an object of claim 16, wherein performing the manipulation of the object comprises:
using the suction force to lift the object from a first surface;
moving a location of the object while the suction force retains the object to the MEMS element; and
removing the suction force and releasing the object from the MEMS element, thereby placing the object on a second surface.

* * * * *